US007300886B1

(12) United States Patent
Ngo et al.

(10) Patent No.: US 7,300,886 B1
(45) Date of Patent: Nov. 27, 2007

(54) INTERLAYER DIELECTRIC FOR CHARGE LOSS IMPROVEMENT

(75) Inventors: Minh Van Ngo, Fremont, CA (US);
Ning Cheng, San Jose, CA (US);
Wenmei Li, Sunnyvale, CA (US);
Angela T. Hui, Fremont, CA (US);
Pei-Yuan Gao, San Jose, CA (US);
Robert A. Huertas, Hollister, CA (US)

(73) Assignees: Spansion LLC, Sunnyvale, CA (US);
Advanced Micro Devices, Inc., Sunnyvale, CA (US)

( * ) Notice: Subject to any disclaimer, the term of this patent is extended or adjusted under 35 U.S.C. 154(b) by 229 days.

(21) Appl. No.: 11/147,208

(22) Filed: Jun. 8, 2005

(51) Int. Cl.
*H01L 21/31* (2006.01)
(52) U.S. Cl. .................. 438/761; 438/778; 438/699; 438/786; 257/E21.209
(58) Field of Classification Search .............. 438/761, 438/778, 699, 786
See application file for complete search history.

(56) References Cited

U.S. PATENT DOCUMENTS

| 5,160,998 | A | * | 11/1992 | Itoh et al. ............... 257/760 |
| 6,337,282 | B2 | * | 1/2002 | Kim et al. ................ 438/699 |
| 6,489,254 | B1 | * | 12/2002 | Kelkar et al. ............. 438/778 |
| 6,613,657 | B1 | | 9/2003 | Ngo et al. ................ 438/588 |
| 6,653,191 | B1 | * | 11/2003 | Yang et al. ............... 438/258 |
| 2003/0157768 | A1 | * | 8/2003 | Nakabayashi et al. ...... 438/258 |
| 2005/0051831 | A1 | * | 3/2005 | Kajimoto et al. ........... 257/314 |
| 2005/0199943 | A1 | * | 9/2005 | Nakagawa ................ 257/317 |

* cited by examiner

*Primary Examiner*—Asok K. Sarkar
*Assistant Examiner*—Victor V. Yevsikov
(74) *Attorney, Agent, or Firm*—Harrity Snyder, LLP

(57) ABSTRACT

A method of manufacturing a memory device includes forming a first dielectric layer over a substrate and forming a charge storage element over the first dielectric layer. The method also includes forming a second dielectric layer over the charge storage element and forming a control gate over the second dielectric layer. The method further includes depositing an interlayer dielectric over the control gate at a high temperature.

20 Claims, 13 Drawing Sheets

INTERLAYER DIELECTRIC FOR CHARGE LOSS IMPROVEMENT

TECHNICAL FIELD

The present invention relates generally to semiconductor devices and methods of manufacturing semiconductor devices. The invention has particular applicability to memory devices and improving reliability for memory devices.

BACKGROUND ART

The escalating demands for high density and performance associated with non-volatile memory devices, such as electrically erasable programmable read only memory (EEPROM) devices, require small design features, high reliability and increased manufacturing throughput. The reduction of design features, however, challenges the limitations of conventional methodology and often makes it difficult for the memory device to meet its expected data retention requirement.

For example, charge leakage may occur from one or more memory cells of the memory device due to poor quality interlayer dielectrics that may include voids. Such charge leakage may result in the memory device being unable to meet the expected data retention requirement and, ultimately, may lead to device failure.

DISCLOSURE OF THE INVENTION

Implementations consistent with the invention reduce charge loss problems in a memory device by depositing an interlayer dielectric material using a relatively high temperature process. Depositing the interlayer dielectric at a high temperature may result in better gap fill properties associated with the interlayer dielectric and may reduce charge loss problems in the memory device.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a method of manufacturing a memory device is provided. The method includes forming a first dielectric layer over a substrate and forming a charge storage element over the first dielectric layer. The method also includes forming a second dielectric layer over the charge storage element and forming a control gate over the second dielectric layer. The method further includes depositing an interlayer dielectric over the control gate at a temperature greater than about 650° C.

According to another aspect consistent with the invention, a method of manufacturing a non-volatile memory device includes forming a plurality of memory cells. The method also includes depositing an interlayer dielectric over the plurality of memory cells at a temperature greater than 650° C.

According to a further aspect consistent with the invention, a method of manufacturing a non-volatile memory device includes forming a first dielectric layer over a substrate and forming a charge storage element over the first dielectric layer, where the charge storage element includes a nitride. The method also includes forming a second dielectric layer over the charge storage element and forming a control gate electrode over the second dielectric layer. The method further includes depositing an interlayer dielectric over the control gate electrode at a temperature greater than 600° C.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Figure 1:
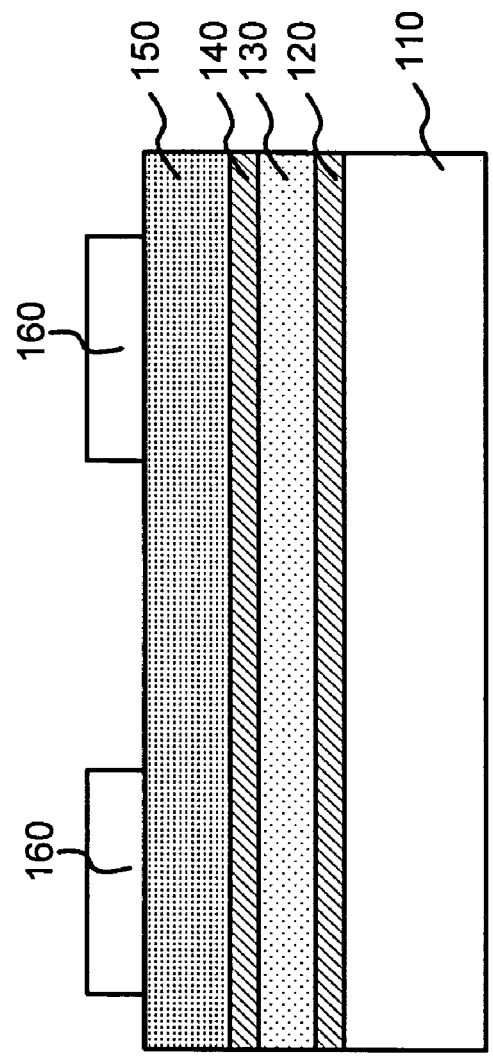
FIG. 1 is a cross-section illustrating exemplary layers used to form memory cells in accordance with an embodiment of the invention.

FIG. 1 illustrates the cross-section of a semiconductor device 100 formed in accordance with an embodiment of the invention. Referring to FIG. 1, semiconductor device 100 may include layers 110, 120, 130, 140 and 150. In an exemplary embodiment, layer 110 may be a substrate of semiconductor device 100 and may include silicon, germanium, silicon-germanium or other semiconducting materials.

In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., $SiO_2$), and may have a thickness ranging from, for example, about 50 Å to about 100 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride) or an oxynitride. Layer 130, consistent with the invention, may act as a charge storage layer for semiconductor device 100 and may have a thickness ranging from, for example, about 80 Å to about 120 Å. In alternative implementations, layer 130 may include a conductive material, such as polycrystalline silicon, used to form a floating gate electrode.

Layer 140 may be formed on layer 130 in a conventional manner and may include a dielectric material, such as an oxide (e.g., $SiO_2$). Alternatively, layer 140 may be a composite that includes a number of dielectric layers or films. Layer 140 may have a thickness ranging from, for example, about 60 Å to about 90 Å and may function as an inter-gate dielectric for memory cells in semiconductor device 100.

Layer 150 may include a conductive material, such as polycrystalline silicon, formed on layer 140 in a conventional manner. Alternatively, layer 150 may include other semiconducting materials, such as germanium or silicon-germanium, or various metals, such as titanium or tungsten. Layer 150, consistent with the invention, may be used to form one or more control gate electrodes for one or more memory cells in semiconductor device 100. In an exemplary implementation, layer 150 may have a thickness ranging from, for example, about 1000 Å to about 2000 Å.

A photoresist material may be patterned and etched to form masks 160 on the top surface of layer 150, as illustrated in FIG. 1. Masks 160 may be used to facilitate formation of one or memory cells in semiconductor device 100, as described in more detail below.

Figure 2:
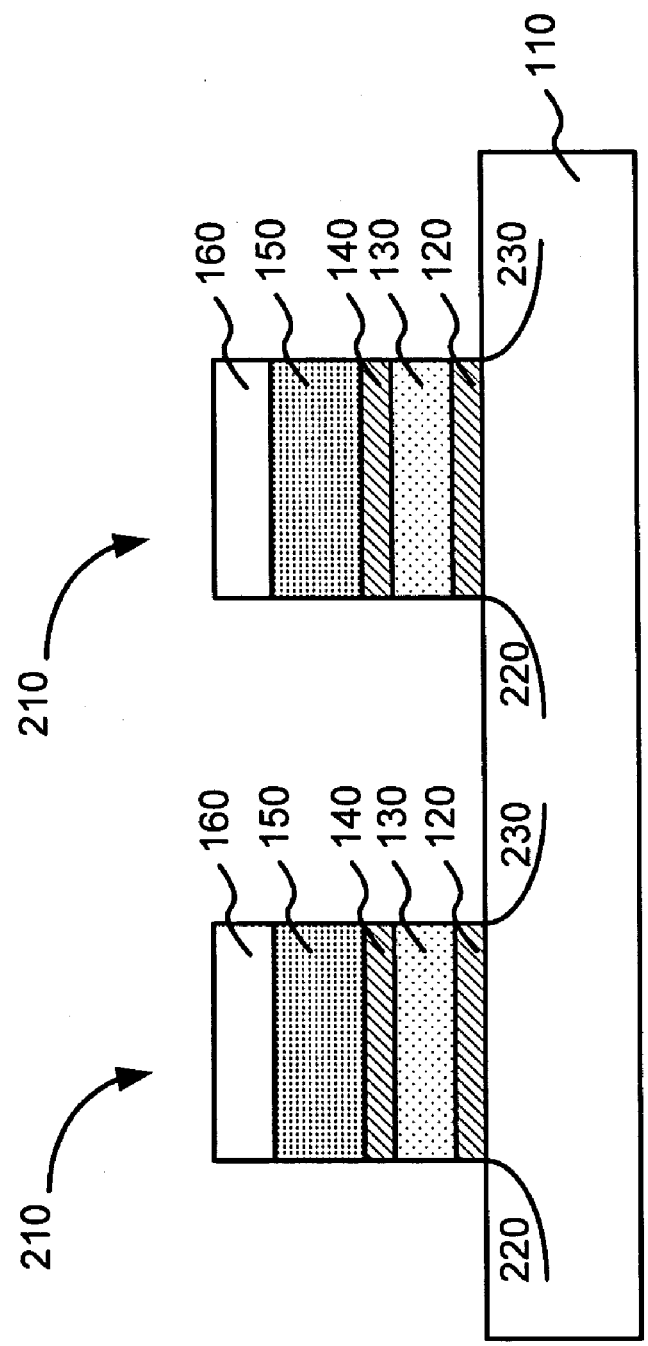
FIG. 2 is a cross-section illustrating the formation of memory cells in accordance with an embodiment of the invention.

Semiconductor device 100 may then be etched, as illustrated in FIG. 2. Referring to FIG. 2, layers 120-150 may be etched in a conventional manner with the etching terminating at substrate 110, thereby forming structures 210. Alternatively, the etching may terminate at an other layer, such as layer 140, followed in some implementations by additional etching, to form structures 210. Each structure 210 (also referred to herein as a memory cell 210) may represent a memory cell of semiconductor device 100, where each memory cell 210 includes a dielectric layer 120, a charge storage layer 130, an inter-gate dielectric layer 140 and a control gate electrode 150. Only two memory cells 210 are illustrated in semiconductor device 100 in FIG. 2 for simplicity. It should be understood that semiconductor device 100 may typically include a memory array including a large number of memory cells 210.

In an exemplary implementation consistent with the invention, each memory cell 210 may be a SONOS-type memory cell, with a silicon control gate electrode 150 formed on an oxide-nitride-oxide (ONO) stack (i.e., layers 140, 130 and 120), with nitride layer 130 acting as a charge storage layer, and the ONO stack being formed on a silicon substrate 110.

Source and drain regions 220 and 230 may then be formed in substrate 110, as illustrated in FIG. 2. For example, n-type or p-type impurities may be implanted in substrate 110 to form source and drain regions 220 and 230, based on the particular end device requirements. In one implementation, an n-type dopant, such as phosphorous or arsenic, may be implanted. Alternatively, a p-type dopant, such as boron, may be implanted. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3A:
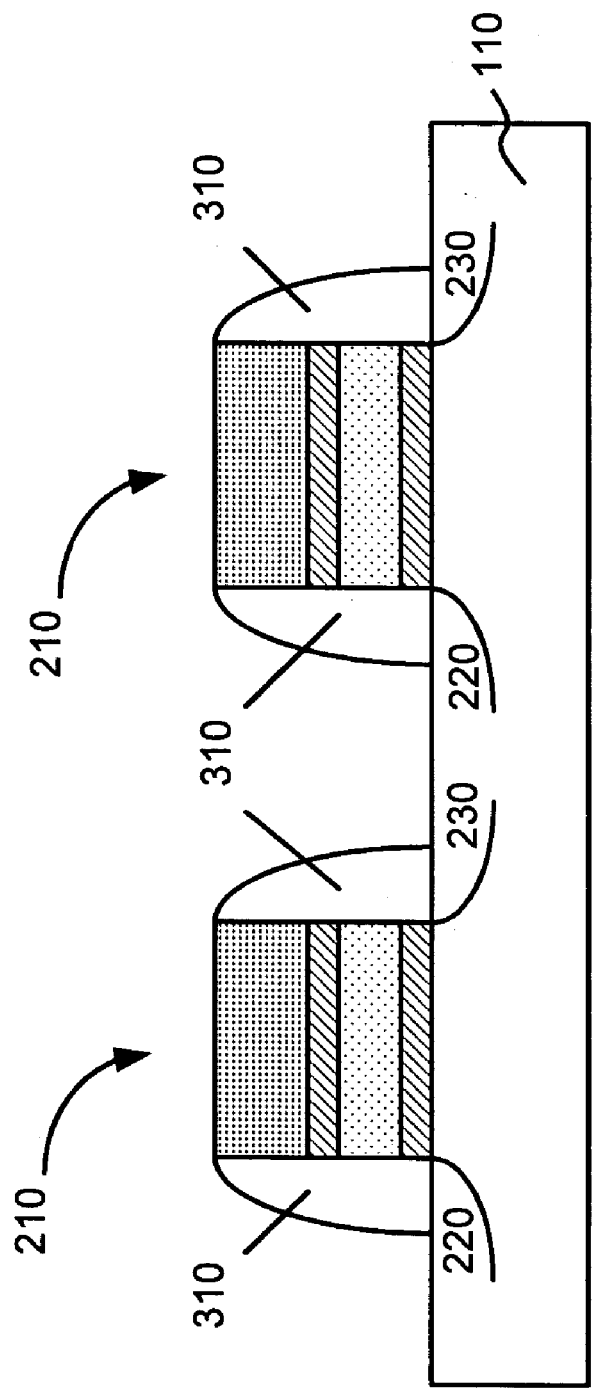
FIG. 3A is a cross-section illustrating the formation of spacers on the device of FIG. 2 in accordance with an embodiment of the invention.

Photoresist masks 160 may be removed using a conventional process. Spacers 310 may be formed adjacent the sidewalls of the memory cells 210, as illustrated in FIG. 3A. For example, a dielectric material, such as a silicon oxide, a silicon nitride, a silicon oxynitride or another dielectric material, may be deposited and etched to form spacers 310 on each side of memory cells 210, as illustrated in FIG. 3A. Spacers 310 may be used to electrically isolate adjacent memory cells 210 from each other. Spacers 310 may also be used to facilitate the deposition of impurities in semiconductor device 100.

Figure 3B:
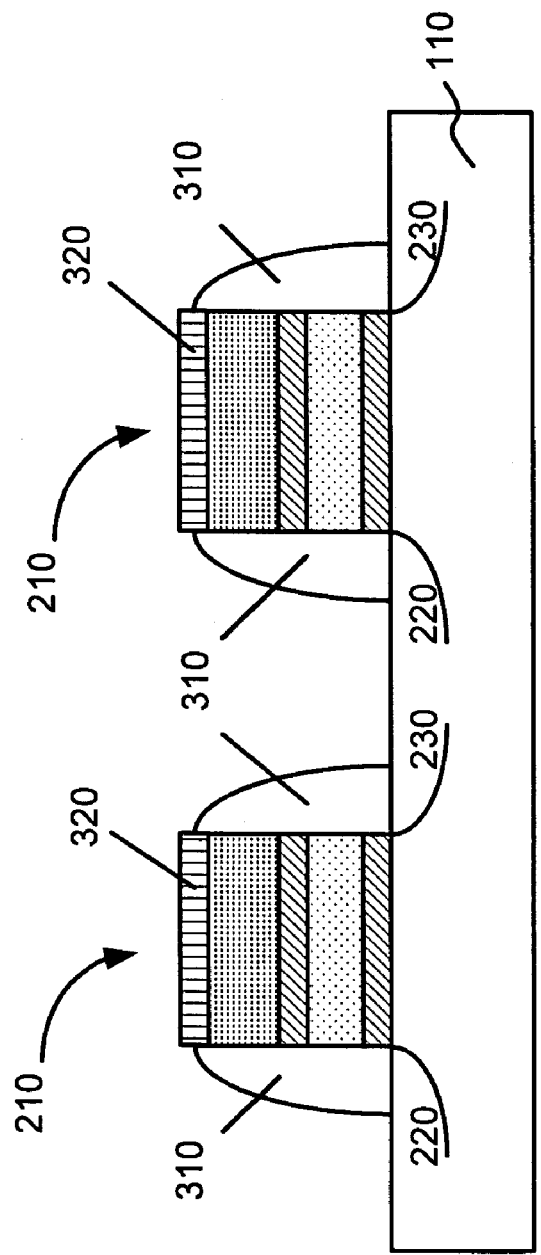
FIG. 3B is a cross-section illustrating the formation of a silicide on the device of FIG. 3A in accordance with an embodiment of the invention.

A metal may then be deposited over semiconductor device 100, followed by an annealing to form a metal-silicide compound. For example, a metal, such as cobalt, titanium or nickel, may be deposited over the surface of semiconductor device 100. An annealing procedure may be performed to form a metal-silicide layer 320 over the surface of control gate electrodes 150, as illustrated in FIG. 3B. In an exemplary implementation, metal-silicide layer 320 may be cobalt silicide and may have a thickness ranging from about 100 Å to about 300 Å. The metal-silicide may also be formed over the portion of source/drain regions 220 and 230 not covered by spacers 310. The metal-silicide formed over source/drain regions 220 and 230 is not shown in FIG. 3B for simplicity. Unreacted metal may be removed from over spacers 310.

Figure 4A:
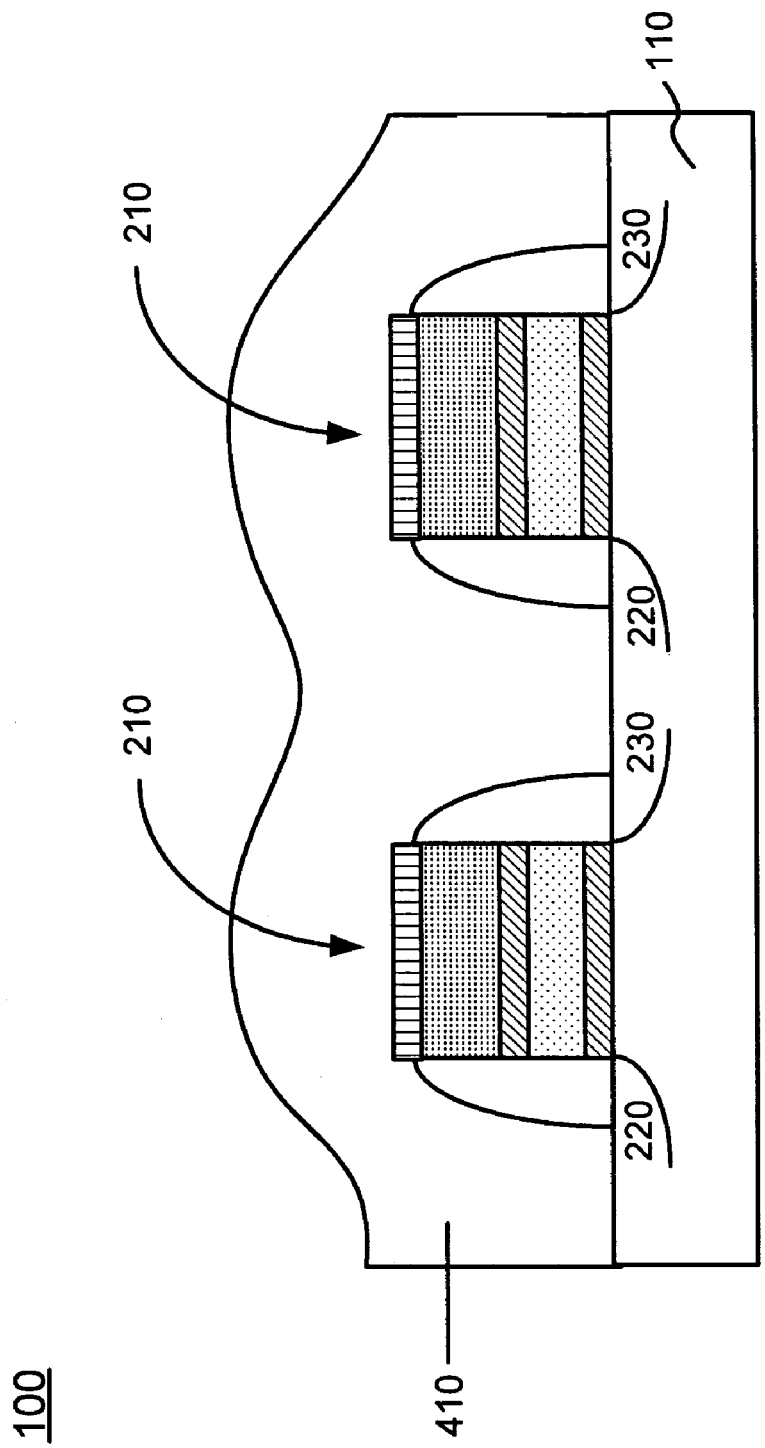
FIG. 4A is a cross-section illustrating the formation of an interlayer dielectric on the device of FIG. 3B in accordance with an embodiment of the invention.

A dielectric layer 410 may then be deposited over semiconductor device 100, as illustrated in FIG. 4A. Dielectric layer 410, also referred to as interlayer dielectric (ILD) 410, may include, for example, a boro-phosphosilicate glass (BPSG) material or a phosphosilicate glass (PSG) material. Dielectric layer 410 may have a thickness ranging from about 5,500 Å to about 8,500 Å.

In an exemplary embodiment, ILD 410 may be deposited at a relatively high temperature to improve gap fill properties of ILD 410. For example, BPSG (or PSG) may be deposited using a chemical vapor deposition (CVD) process performed at a temperature ranging from about 500° C. to about 750° C. In one implementation, BPSG may be used to form ILD 410 and the BPSG may be deposited at about 650° C. It has been found that depositing the BPSG ILD 410 using a higher temperature deposition process, e.g., greater than about 500° C., than that conventionally used to deposit such a dielectric improves the gap fill properties associated with ILD 410. That is, the BPSG is able to fill very small spaces, such as the spaces between adjacent memory cells 210 that may have small aspect ratios, without voids. Eliminating such voids helps reduce charge leakage in the memory cells 210. In addition, depositing BPSG ILD 410 at a high temperature, such as greater than 650° C., may eliminate the need to perform a further high temperature densification procedure with respect to ILD 410. Such a densification procedure is typically performed to increase the density and improve the gap fill properties of ILD 410. Eliminating this densification saves time and also reduces other problems associated with memory cells 210.

For example, performing a high temperature densification may adversely affect other devices or structures in semiconductor device 100, such as various conductive structures. As discussed above, metal-silicide layer 320 may be a cobalt silicide formed over the upper surface of control gate 150 and source/drain regions 220 and 230. It has been found that performing a high temperature densification procedure associated with ILD 410, such as, for example, a rapid thermal anneal for about two minutes at about 840° C., results in larger grain size and a rough surface associated with metal-silicide layer 320 (e.g., a cobalt-silicide layer). This rough metal-silicide layer 320 surface then creates a rough interface between the metal-silicide layer 320 and other materials and/or junctions that contact metal-silicide layer 320, such as source/drain junctions, gate junctions, etc., and may cause charge leakage at these junctions. Therefore, eliminating the densification procedure associated with ILD 410 advantageously eliminates this charge leakage problem associated with memory cells 210.

Further, depositing BPSG (or PSG) ILD 410 at a high temperature has been shown to result in low hydrogen and low hydroxide (OH) groups. For example, a BPSG film may be formed using a silane ($SiH_4$) reactant or a tetraethyl orthosilicate (TEOS) based reactant. Both of these compounds contain hydrogen, which react with $N_2O$ or $O_3$ at certain temperatures. For example, silane may react with $N_2O$ at a temperature range of, for example, 300° C. to 450° C. to produce $SiO_2$, $N_2$, $H_2$ and possibly hydroxide groups. It has been found that depositing BPSG or PSG at high temperatures, such as greater than 500° C., reduces the formation of hydrogen and hydroxide groups.

It has also been found that BPSG or PSG deposited at low temperatures, such as less than 350° C., exhibits lower density, (e.g., have an index of refraction of about 1.44). These BPSG or PSG films are therefore much more porous and contain more moisture (e.g., OH) than BPSG or PSG films deposited at higher temperatures and/or these BPSG or PSG films will absorb more moisture after deposition. Depositing BPSG (or PSG) ILD 410 at higher temperatures, such as greater than 500° C., advantageously reduces or eliminates this moisture problem, which can cause charge leakage. Therefore, depositing BPSG (or PSG) ILD 410 at a high temperature reduces charge loss problems with respect to memory cells 210 without causing any negative effects.

Figure 4B:
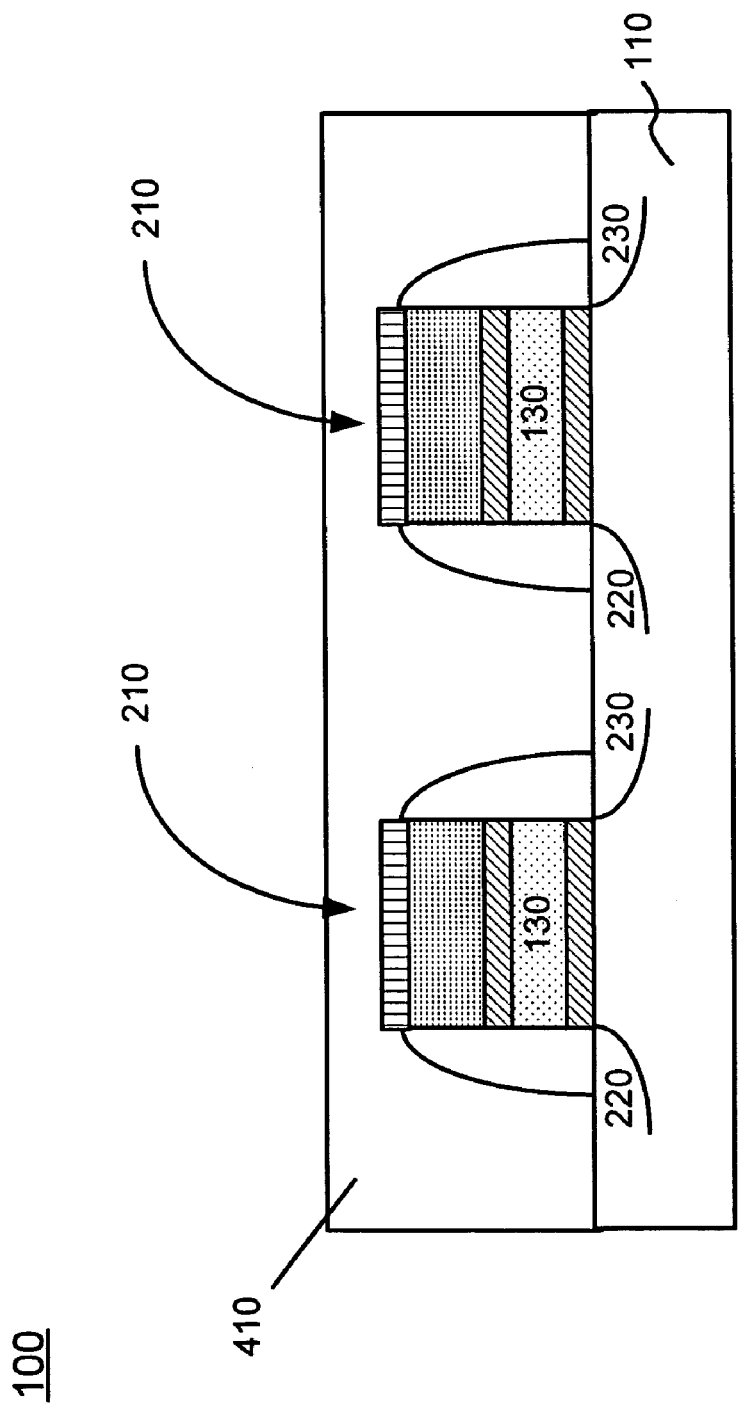
FIG. 4B is a cross-section illustrating the planarization of the interlayer dielectric of FIG. 4B in accordance with an embodiment of the invention.

ILD 410 may optionally be planarized using a conventional process, such as a chemical-mechanical polishing (CMP) process, as illustrated in FIG. 4B. Referring to FIG. 4B, the CMP process may planarize the top surface of ILD 410 to facilitate formation of subsequent structures, such as interconnect lines. ILD 410, consistent with the invention, may represent an ILD located closest to substrate 110. In alternative implementations, ILD 410 may represent an interlayer dielectric formed a number of layers above the surface of substrate 110. In each case, ILD 410 functions to isolate various conductive structures, such as various interconnect lines described below or to isolate source region 220 or drain region 230 from other conductive structures.

Figure 5A:
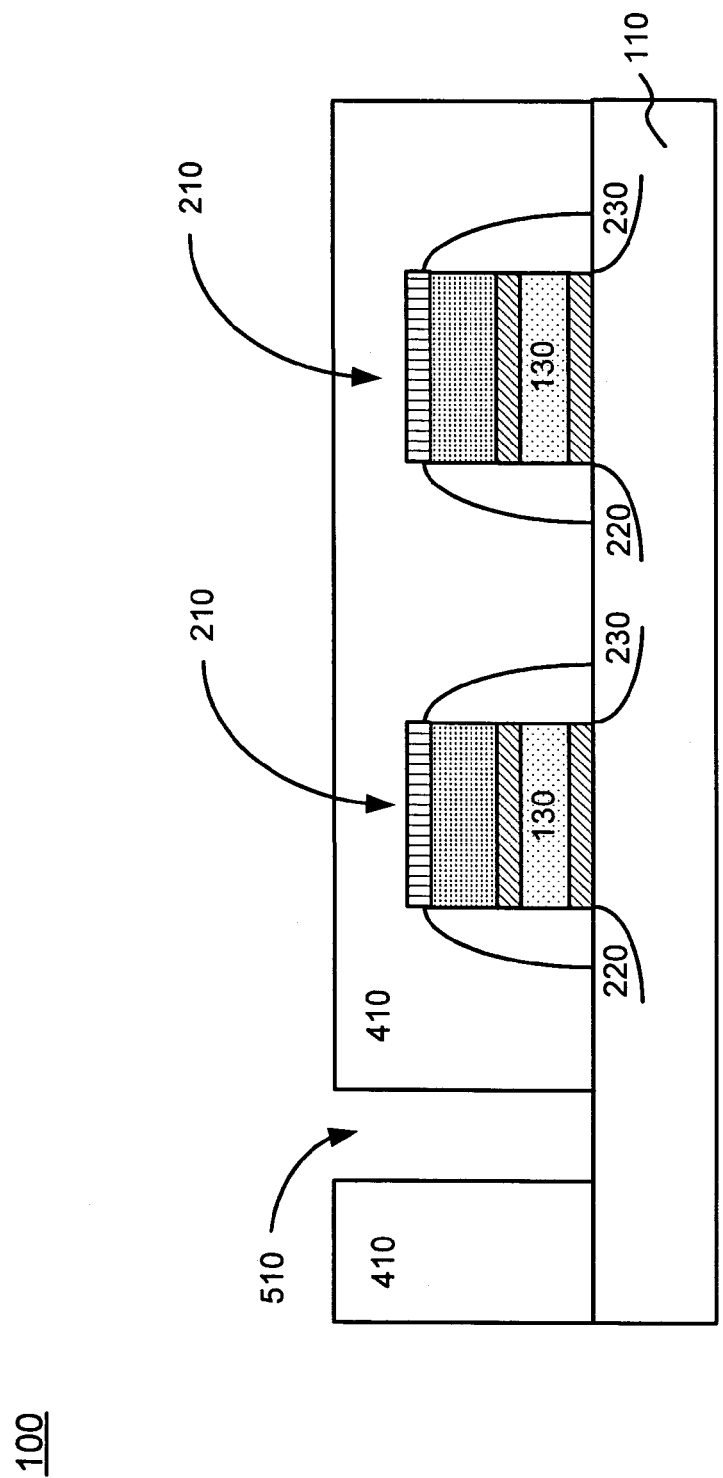
FIGS. 5A and 5B are cross-sections illustrating the formation of a contact in the interlayer dielectric of FIG. 4B in accordance with an embodiment of the invention.
Figure 5B:
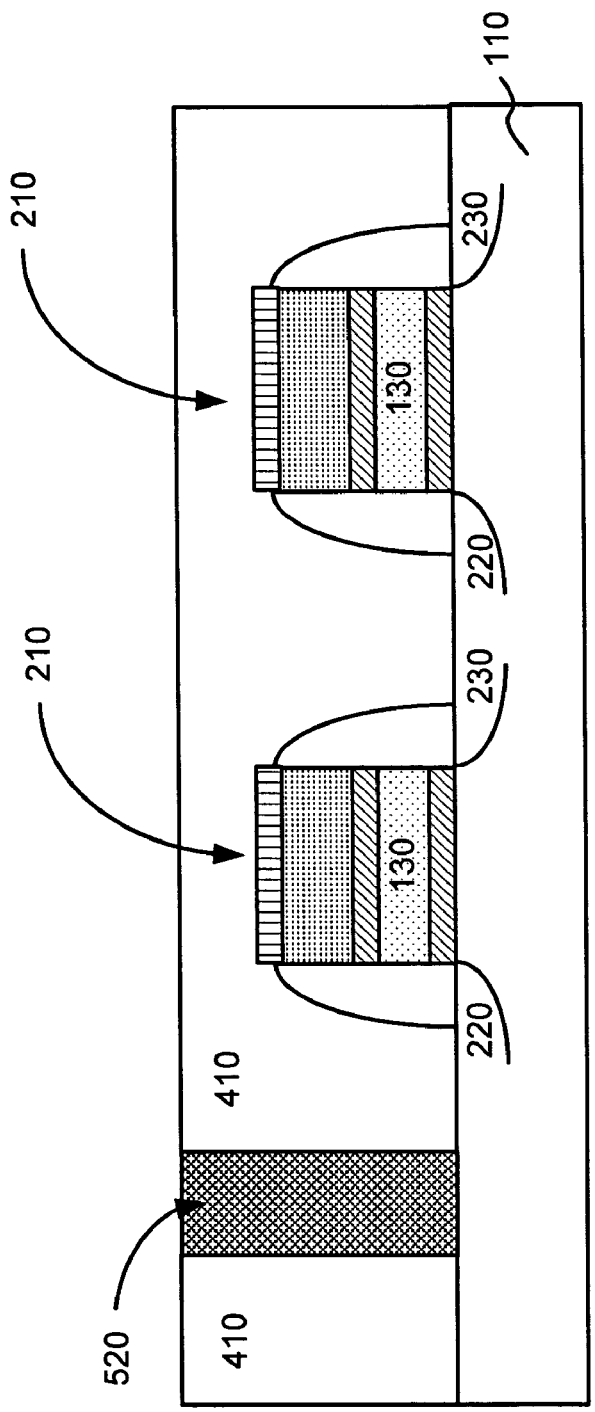

A trench or via 510 may be formed in ILD 410 using conventional photolithographic and etching techniques, as illustrated in FIG. 5A. Trench/via 510 may be used to form a contact to source region 220 or drain region 230. Next, a metal layer 520, such as tungsten, copper or aluminum, may be deposited to fill trench/via 510, as illustrated in FIG. 5B. Metal layer 520 may represent a contact to, for example, source region 220.

Figure 6:
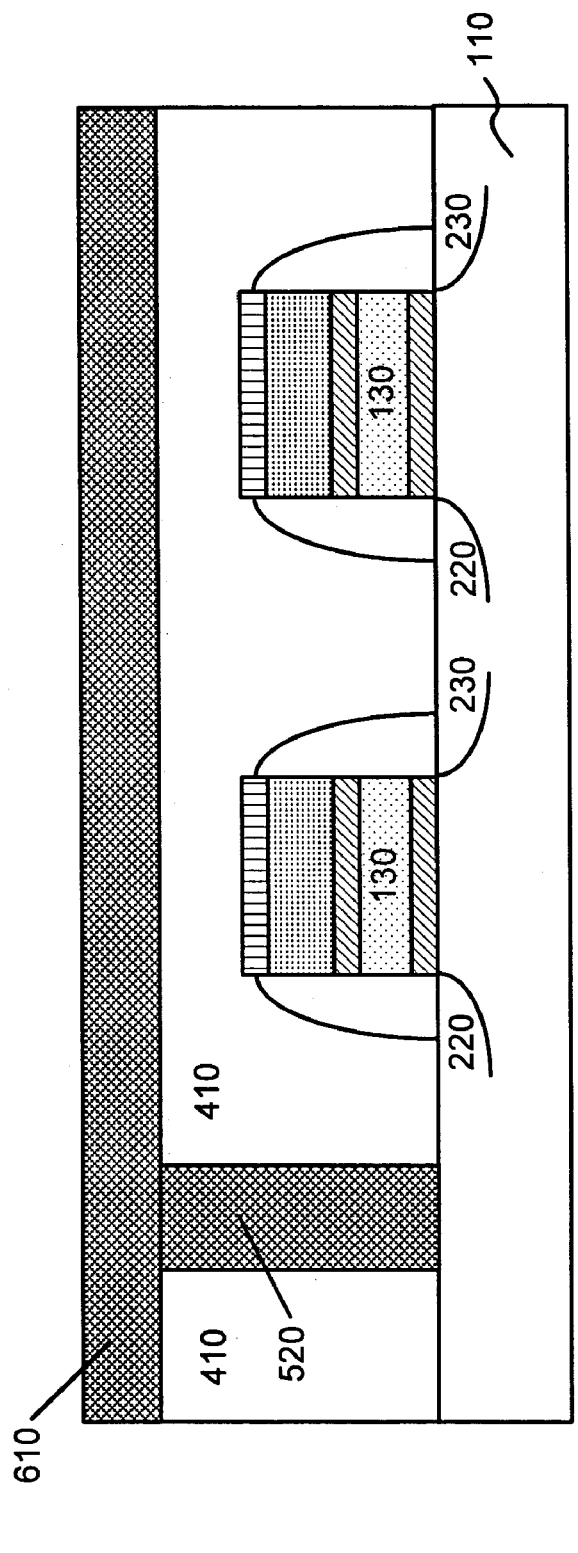
FIG. 6 is a cross-section illustrating the formation of a conductive interconnect on the device of FIG. 5B in accordance with an embodiment of the invention.

A conductive interconnect line 610 may then be formed over the planarized top surface of ILD 410, as illustrated in FIG. 6. For example, a metal, such as copper or aluminum, may be deposited to form conductive line 610 that connects various features in semiconductor device 100, such as source or drain regions 220/230 through contact 520 to an external electrode (not shown). Alternatively, conductive line 610 may connect various memory cells 210 in semiconductor device 100. Conductive line 610 may facilitate programming or erasing various memory cells 210 in semiconductor device 100.

Figure 7:
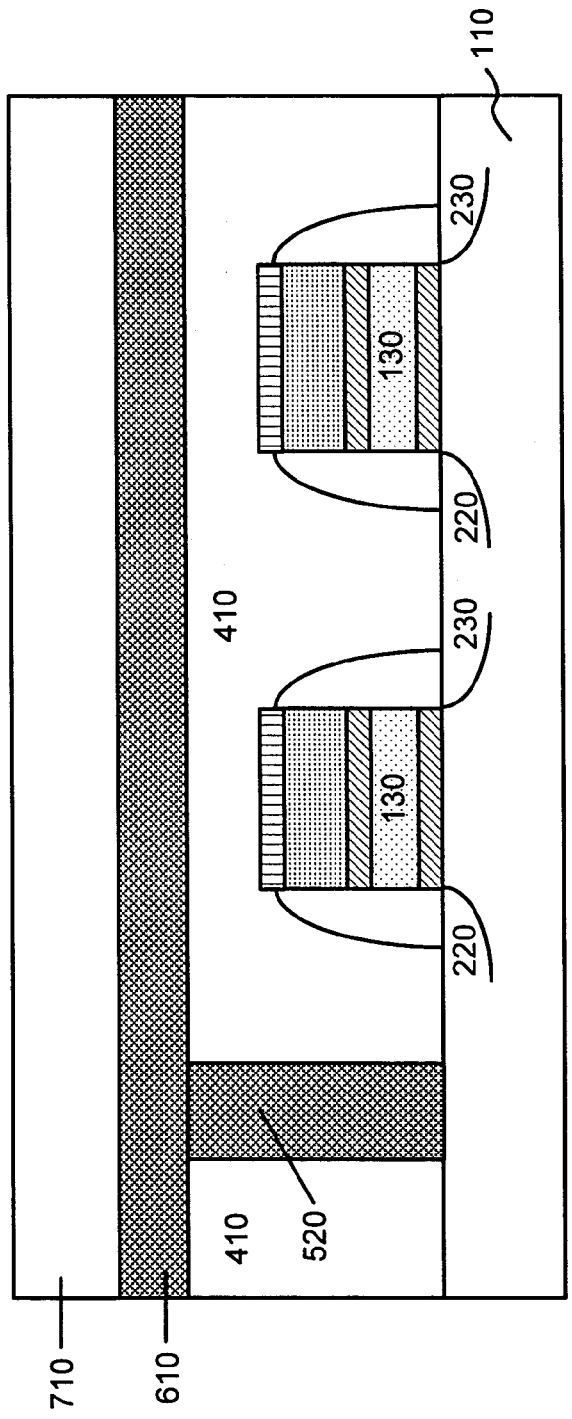
FIG. 7 is a cross-section illustrating the formation of an interlayer layer dielectric on the device of FIG. 6 in accordance with an embodiment of the invention.

An ILD 710 may be formed over conductive line 610, as illustrated in FIG. 7. ILD 710, consistent with the invention, may include, for example, an oxide, such as $SiO_2$, or a fluorine doped silicate glass (FSG) material. ILD 710 may have a thickness ranging from about 2,500 Å to about 3,500 Å and may be deposited at a temperature ranging from, for example, about 300° C. to about 400° C. Depositing ILDs formed after ILD 410, such as ILD 710, at a temperature less than 400° C. prevents other problems associated with semiconductor device 100. For example, depositing ILD 710 at a temperature of greater than 400° C. may cause hillock formation, such as copper hillocks, in semiconductor device 100 which may result in shorting problems for semiconductor device 100. It has been found that depositing ILD 710 at a temperature of less than 400° C. reduces or eliminates hillock related problems. Therefore, depositing subsequent ILDs, such as ILD 710, at a temperature of less than 400° C. further improves the reliability associated with semiconductor device 100.

Figure 8:
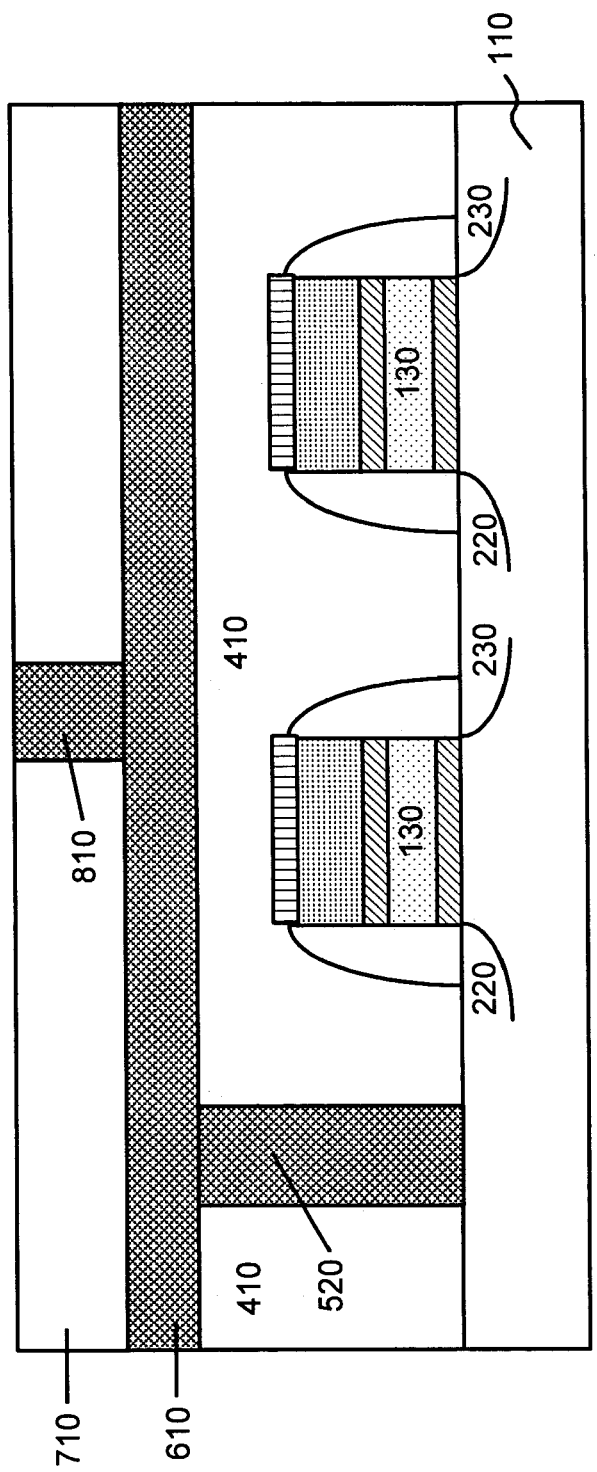
FIG. 8 is a cross-section illustrating the formation of a contact in the interlayer dielectric of FIG. 7 in accordance with an embodiment of the invention.

Various back end of line (BEOL) processing may be performed to complete the fabrication of semiconductor device 100. For example, a trench or via may be formed in ILD 710 followed by deposition of a metal layer 810, such as copper, aluminum or tungsten, as illustrated in FIG. 8. Metal layer 810 may represent a contact to an uppermost conductive layer of semiconductor device 100. Alternatively, metal layer 810 may represent a contact to any one of a number of conductive layers in semiconductor device 100.

Figure 9:
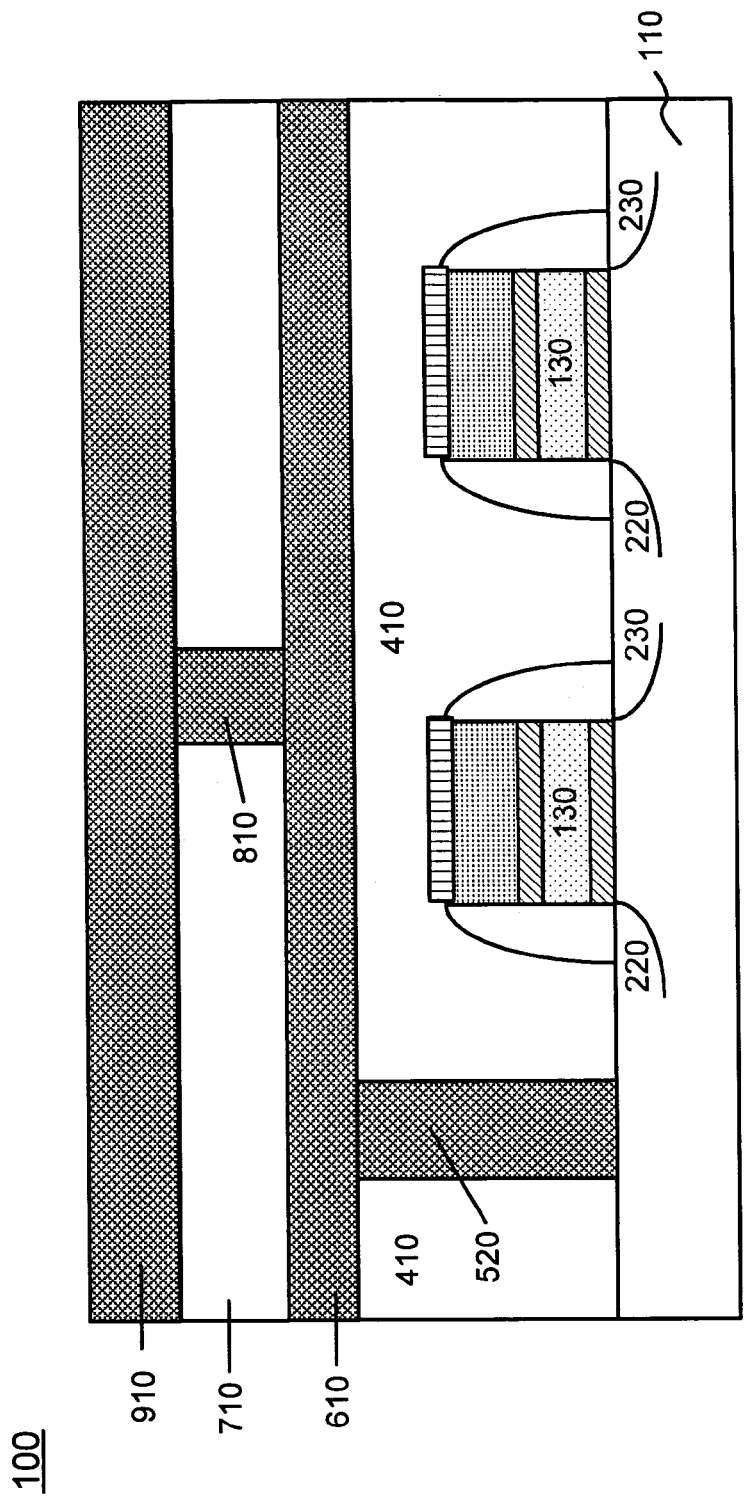
FIG. 9 is a cross-section illustrating the formation of a conductive layer on the device of FIG. 8 in accordance with an embodiment of the invention.

A conductive layer may then be formed over ILD 710. For example, a metal, such as copper or aluminum, may be deposited to form conductive line 910, as illustrated in FIG. 9. Conductive line 910 may represent a BEOL structure or connector that connects various features in semiconductor device 100, such as source or drain regions 220/230 to an external electrode (not shown), to facilitate programming or erasing of various memory cells 210 in semiconductor device 100.

A top dielectric layer 1010, also referred to as cap layer 1010, may be formed over conductive line 910. In an exemplary embodiment, cap layer 1010 may be deposited to a thickness ranging from about 6,000 Å to about 10,000 Å. Cap layer 1010 may act as a protective layer to prevent damage to conductive line 910 and other portions of semiconductor device 100 during subsequent processing. For example, cap layer 1010 may protect semiconductor device 100 against impurity contamination during subsequent cleaning processes that may be used to complete a working memory device.

Figure 10:
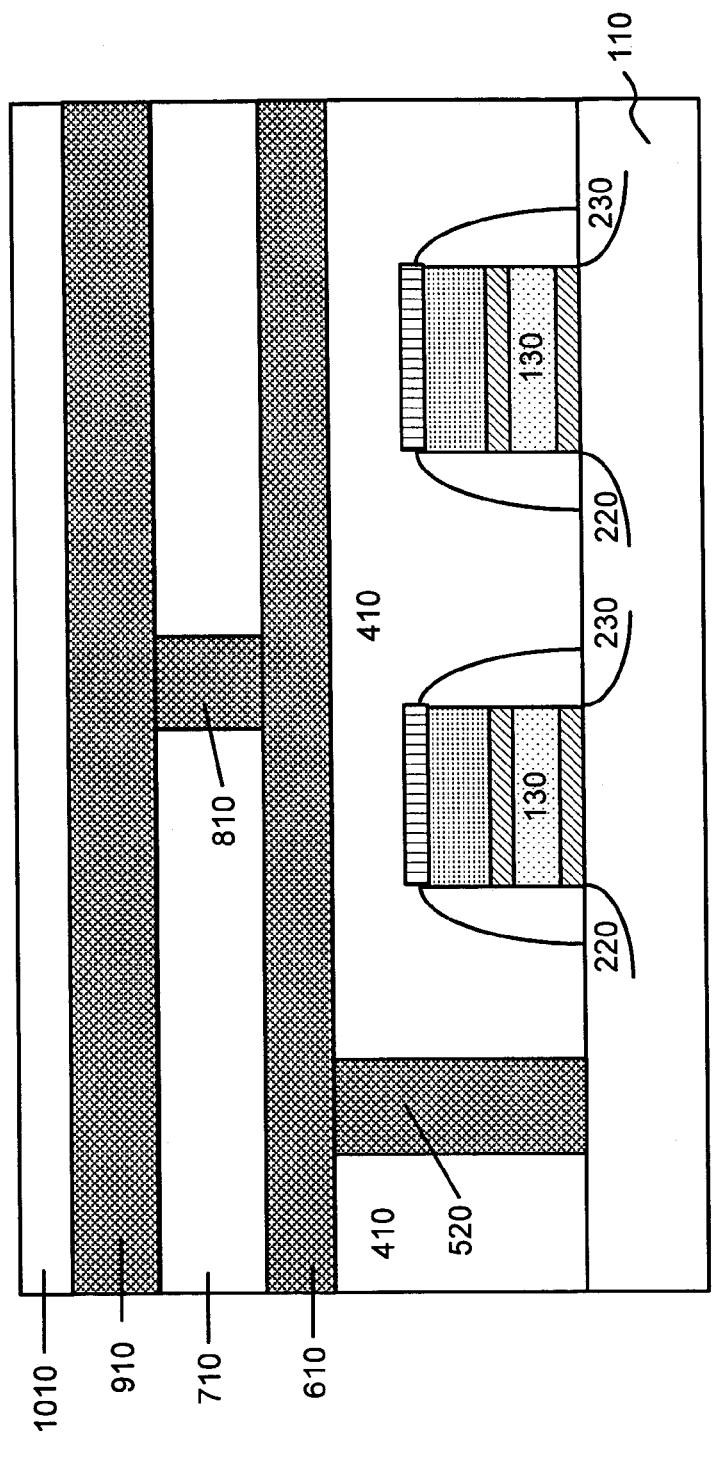
FIG. 10 is a cross-section illustrating the formation of a dielectric layer on the device of FIG. 9 in accordance with an embodiment of the invention.

While only two ILDs (i.e., ILDs 410 and 710) and two conductive layers (i.e., layers 610 and 910) are illustrated in FIG. 10 for simplicity, it should be understood that semiconductor device 100 may include more ILD layers and conductive layers based on the particular circuit requirements.

As described above, in an exemplary embodiment, semiconductor device 100 illustrated in FIG. 10 may be a SONOS type memory device, with nitride layer 130 acting as a charge storage element for each memory cell 210. Each memory cell 210 may be an EEPROM type memory device and one or more programming circuits (not shown) may be used to facilitate programming and erasing of one or more memory cells 210 of semiconductor device 100. Programming of memory cell 210 may be accomplished by applying a voltage to control gate 150. Once programmed, electrons remain trapped in nitride layer 130 until an erase procedure is performed.

In an exemplary implementation consistent with the invention, each of memory cells 210 illustrated in FIG. 10 may be configured to store two bits of data. That is, charge storage layer 130 may be programmed to store charges representing two separate bits of data by localizing the first and second charges to the respective left and right sides of charge storage layer 130 illustrated in FIG. 10. For example, each of the two bits of memory cell 210 may be programmed independently by, for example, channel hot electron injection, to store charges representing a bit on each respective side of the charge storage layer 130. In this manner, the charges in charge storage layer 130 become effectively trapped on each respective side of charge storage layer 130. Erasing of each bit in memory cell 210 may also be performed independently. During erasing, the charges stored in charge storage layer 130 may tunnel through dielectric layer 120 into the source region 220 and drain region 230, respectively.

In this manner, the density of the array of memory cells 210 in semiconductor device 100 may be increased as compared to conventional memory devices that store only one bit of data per cell. In alternative implementations, each memory cell 210 may be configured to store a charge representing one bit of data per memory cell 210. In addition, in alternative implementations, semiconductor device 100 may be a floating gate memory device in which layer 130 is formed from a conductive material, such as polysilicon, and functions as a charge storage element for each memory cell 210.

In summary, implementations consistent with the invention deposit an interlayer dielectric at a high temperature. Advantageously, the gap fill properties of the interlayer dielectric may be improved and subsequent densification processes may be eliminated. The memory cells 210 of semiconductor device 100 exhibit improved resistance to charge leakage and, therefore, increased reliability.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of manufacturing a memory device, comprising:
    forming a first dielectric layer over a substrate;
    forming a charge storage element over the first dielectric layer;
    forming a second dielectric layer over the charge storage element;
    forming a control gate over the second dielectric layer; and
    depositing an interlayer dielectric over the control gate at a temperature greater than about 650° C.

2. The method of claim 1, wherein the interlayer dielectric comprises boro-phosphosilicate glass.

3. The method of claim 1, wherein the depositing the interlayer dielectric comprises depositing the interlayer dielectric to a thickness ranging from about 5,500 Å to about 8,500 Å.

4. The method of claim 1, further comprising:
    forming a silicide over the control gate.

5. The method of claim 4, wherein the forming a silicide comprises:
    depositing a metal over the control gate, and
    annealing the semiconductor device to form a metal-silicide compound.

6. The method of claim 5, wherein the metal-silicide compound comprises cobalt silicide.

7. The method of claim 1, wherein the deposited interlayer dielectric is substantially free of voids without requiring a densification procedure.

8. The method of claim 1, further comprising:
    forming a plurality of memory cells, each of the memory cells being configured to store charges representing two bits of information.

9. A method of manufacturing a non-volatile memory device, comprising:
    forming a plurality of memory cells; and
    depositing an interlayer dielectric over the plurality of memory cells at a temperature greater than 650° C.

10. The method of claim 9, wherein the interlayer dielectric comprises boro-phosphosilicate glass.

11. The method of claim 10, wherein the depositing the interlayer dielectric comprises depositing the interlayer dielectric to a thickness ranging from about 5,500 Å to about 8,500 Å.

12. The method of claim 9, wherein each of the memory cells includes a first dielectric layer formed over a substrate, a charge storage element formed over the first dielectric layer, a second dielectric layer formed over the charge storage element and a control gate formed over the second dielectric layer, the method further comprising:
   forming a silicide over the control gate.

13. The method of claim 12, wherein the forming a silicide comprises:
   depositing a metal over the control gate, and
   annealing the semiconductor device to form a metal-silicide.

14. The method of claim 13, wherein the metal comprises at least one of cobalt, titanium or nickel.

15. The method of claim 9, further comprising:
   depositing a conductive layer over the interlayer dielectric without performing a densification process with respect to the interlayer dielectric; and
   depositing a second interlayer dielectric over the conductive layer at a temperature ranging from 300° C. to 400° C.

16. The method of claim 9, wherein each of the plurality of memory cells stores charges representing two bits of information.

17. A method of manufacturing a non-volatile memory device, comprising:
   forming a first dielectric layer over a substrate;
   forming a charge storage element over the first dielectric layer, the charge storage element comprising a nitride;
   forming a second dielectric layer over the charge storage element;
   forming a control gate electrode over the second dielectric layer; and
   depositing an interlayer dielectric over the control gate electrode at a temperature greater than 600° C.

18. The method of claim 17, further comprising:
   forming a silicide over a top surface of the control gate electrode, the silicide having a substantially smooth upper surface.

19. The method of claim 17, wherein the interlayer dielectric comprises at least one of boro-phosphosilicate glass or phosphosilicate glass.

20. The method of claim 17, wherein the charge storage element associated with each memory cell in the non-volatile memory device is configured to store charges representing two bits of information.

* * * * *